(12) United States Patent
Lee et al.

(10) Patent No.: US 11,069,303 B2
(45) Date of Patent: Jul. 20, 2021

(54) ORGANIC LIGHT-EMITTING DISPLAY DEVICE AND METHOD OF DRIVING THE SAME

(71) Applicant: Samsung Display Co., Ltd., Yongin-si (KR)

(72) Inventors: Won Jun Lee, Yongin-si (KR); Choi Ho Kim, Yongin-si (KR); Gun Woo Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 232 days.

(21) Appl. No.: 16/100,132

(22) Filed: Aug. 9, 2018

(65) Prior Publication Data

US 2019/0206334 A1    Jul. 4, 2019

(30) Foreign Application Priority Data

Dec. 28, 2017    (KR) .......................... 10-2017-0182814

(51) Int. Cl.
| | |
|---|---|
| *G09G 3/3291* | (2016.01) |
| *G09G 3/3266* | (2016.01) |
| *H01L 27/32* | (2006.01) |
| *G09G 3/3233* | (2016.01) |
| *G09G 3/20* | (2006.01) |

(52) U.S. Cl.
CPC ............ *G09G 3/3291* (2013.01); *G09G 3/20* (2013.01); *G09G 3/3233* (2013.01); *G09G 3/3266* (2013.01); *H01L 27/3276* (2013.01); *G09G 2310/08* (2013.01)

(58) Field of Classification Search
CPC ...... G09G 3/3291; G09G 3/20; G09G 3/3233; G09G 3/3266; G09G 2310/08; H01L 27/3276
See application file for complete search history.

(56) References Cited

U.S. PATENT DOCUMENTS

| | | | |
|---|---|---|---|
| 8,654,158 B2 | 2/2014 | Tsai et al. | |
| 9,256,109 B2 * | 2/2016 | Kang | ................... G09G 3/3233 |
| 9,424,782 B2 | 8/2016 | Park et al. | |

(Continued)

FOREIGN PATENT DOCUMENTS

| | | |
|---|---|---|
| KR | 10-2017-0080330 | 7/2017 |
| KR | 10-2017-0081015 | 7/2017 |
| KR | 10-2017-0110564 | 10/2017 |

*Primary Examiner* — Patrick N Edouard
*Assistant Examiner* — Eboni N Giles
(74) *Attorney, Agent, or Firm* — H.C. Park & Associates, PLC (57) ABSTRACT

An organic light-emitting display device and a method of driving the same. The organic light-emitting display device is driven, with one frame being divided into a first period, a second period, a third period, and a fourth period, and includes pixels coupled to scan lines and data lines, a first power supply configured to supply first driving power, wherein the first driving power is set to a first voltage during the first period and the fourth period and a second voltage lower than the first voltage during the second period and the third period, a second power supply configured to supply second driving power. The second driving power is set to a third voltage during the first to third periods and to a fourth voltage lower than the third voltage during the fourth period.

17 Claims, 9 Drawing Sheets

(56) References Cited

U.S. PATENT DOCUMENTS

| | | | |
|---|---|---|---|
| 9,653,020 B2 | 5/2017 | Uchino et al. | |
| 2013/0127932 A1* | 5/2013 | Han | G09G 3/3233 |
| | | | 345/691 |
| 2014/0333680 A1* | 11/2014 | Choi | H05B 45/60 |
| | | | 345/690 |
| 2014/0347401 A1* | 11/2014 | Hwang | G09G 3/3233 |
| | | | 345/690 |
| 2014/0354711 A1* | 12/2014 | In | G09G 3/3233 |
| | | | 345/691 |
| 2015/0287393 A1* | 10/2015 | Han | G06T 1/60 |
| | | | 345/213 |
| 2016/0125801 A1* | 5/2016 | Chung | G09G 3/3233 |
| | | | 345/78 |
| 2016/0240145 A1* | 8/2016 | Jeong | G06F 1/04 |
| 2018/0242425 A1* | 8/2018 | Hente | H01L 51/529 |
| 2019/0066589 A1* | 2/2019 | He | G09G 3/3233 |

* cited by examiner

ORGANIC LIGHT-EMITTING DISPLAY DEVICE AND METHOD OF DRIVING THE SAME

CROSS-REFERENCE TO RELATED APPLICATION

This application claims priority from and the benefit of Korean Patent Application No. 10-2017-0182814, filed on Dec. 28, 2017, which is hereby incorporated by reference for all purposes as if fully set forth herein.

BACKGROUND

Field

Exemplary embodiments of the invention relate generally to an organic light-emitting display device and a method of driving the organic light-emitting display device.

Discussion of the Background

With the development of information technology, the importance of a display device that is a connection medium between a user and information has been increasingly emphasized. Accordingly, the use of various display devices, such as a liquid crystal display (LCD) device and an organic light-emitting display device, has increased.

Among the display devices, an organic light-emitting display device displays an image using an organic light-emitting diode (OLED), which emits light via re-coupling of electrons and holes. The organic light-emitting display device is advantageous in that it has a high response speed, provides a large contrast ratio, and is operated with low power consumption.

The organic light-emitting display device includes pixels coupled to data lines and scan lines. Each of the pixels generally includes an OLED, and a driving transistor for controlling the amount of current flowing through the OLED. Such a pixel emits light having predetermined luminance when current is supplied from the driving transistor to the OLED in accordance with a data signal.

Meanwhile, the pixel includes a plurality of transistors and capacitors to compensate for a difference in the threshold voltage of the driving transistor. Such a pixel is driven while compensating for the threshold voltage of the driving transistor for each horizontal line. However, the higher the resolution of a display panel, the shorter a horizontal period. Accordingly, it is difficult to sufficiently compensate for the threshold voltage of the driving transistor. Therefore, there is a need for a pixel in which the threshold voltage of a driving transistor may be stably compensated for, and which may then be applied to a high-resolution panel.

The above information disclosed in this Background section is only for understanding of the background of the inventive concepts, and, therefore, it may contain information that does not constitute prior art.

SUMMARY

Exemplary embodiments of the invention are directed to an organic light-emitting display device which can be applied to a high-resolution panel, and a method of driving the organic light-emitting display device.

Additional features of the inventive concepts will be set forth in the description which follows, and in part will be apparent from the description, or may be learned by practice of the inventive concepts.

An exemplary embodiment of the invention provides an organic light-emitting display device configured to be driven, with one frame being divided into a first period, a second period, a third period, and a fourth period. The organic light-emitting display device includes a first power supply configured to supply first driving power, wherein the first driving power has a first voltage during the first period and the fourth period and a second voltage lower than the first voltage during the second period and the third period; a second power supply configured to supply second driving power, wherein the second driving power has a third voltage during the first to third periods and a fourth voltage lower than the third voltage during the fourth period; and pixels coupled to scan lines and data lines. A pixel disposed on an i-th (where i is a natural number) horizontal line and an m-th (where m is a natural number) vertical line includes an organic light-emitting diode (OLED); a first transistor coupled between a first driving power source and an anode electrode of the OLED, and coupled at a gate electrode thereof to a first node; a second transistor coupled between an m-th data line and the first node, and coupled at a gate electrode thereof to an i-th scan line; and a storage capacitor coupled between the first node and the anode electrode of the OLED.

The organic light-emitting display device may further include a scan driver configured to simultaneously supply scan signals to the scan lines during the first period and the second period, and sequentially supply the scan signals to the scan lines during the third period; and a data driver configured to supply a reference voltage to the data lines during the first period and the second period and supply data signals to the data lines in synchronization with the scan signals during the third period.

The reference voltage may be set to a specific voltage within a voltage range of the data signals that are capable of being supplied from the data driver.

The reference voltage may be set to a voltage level between a data signal voltage corresponding to a black grayscale and a data signal voltage corresponding to grayscale 1.

The third voltage may be set such that the pixels do not emit light, and the fourth voltage is set such that the pixels emit light.

The second transistor may include a plurality of transistors connected in series with each other.

An organic capacitor may be equivalently formed between the anode electrode of the OLED and a second driving power source, and the pixel may further include a first capacitor coupled in parallel to the organic capacitor between the anode electrode of the OLED and the second driving power source.

The pixel may further include a third transistor coupled between the anode electrode of the OLED and an initialization power source, and turned on when a control signal is supplied to a control line.

The control line may be coupled in common to all pixels.

The scan driver may provide the control signal to the control line during the first period.

The organic light-emitting display device may further include a control driver configured to provide the control signal to the control line during the first period.

The first transistor and the second transistor may be P-type transistors.

Another exemplary embodiment of the invention provides a method of driving an organic light-emitting display device, the organic light-emitting display device including a first driving power source that is set to a first voltage during a first period and a fourth period of a frame and that is set to a second voltage lower than the first voltage during a second period and a third period of the frame, a second driving power source that is set to a third voltage during the first to third periods and that is set to a fourth voltage lower than the third voltage during the fourth period, and pixels coupled to the first driving power source and the second driving power source. The method includes supplying a reference voltage to a gate electrode of a driving transistor included in each of the pixels and then supplying the first voltage to an anode electrode of an OLED during the first period; storing a voltage corresponding to a threshold voltage of the driving transistor in a storage capacitor coupled between the gate electrode of the driving transistor and the anode electrode of the OLED during the second period; supplying a voltage corresponding to a data signal to the gate electrode of the driving transistor during the third period; and controlling an amount of current that is supplied to the OLED in response to a voltage applied to the gate electrode of the driving transistor during the fourth period.

The reference voltage may be set such that the driving transistor is turned on.

The pixels may be simultaneously driven during the first, second, and fourth periods, and are driven for each horizontal line during the third period.

Each of the pixels may include a switching transistor coupled between a data line and the driving transistor, and the switching transistors in respective pixels may be set to a turn-on state during the first period and the second period.

The switching transistors may be sequentially turned on for each horizontal line during the third period.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
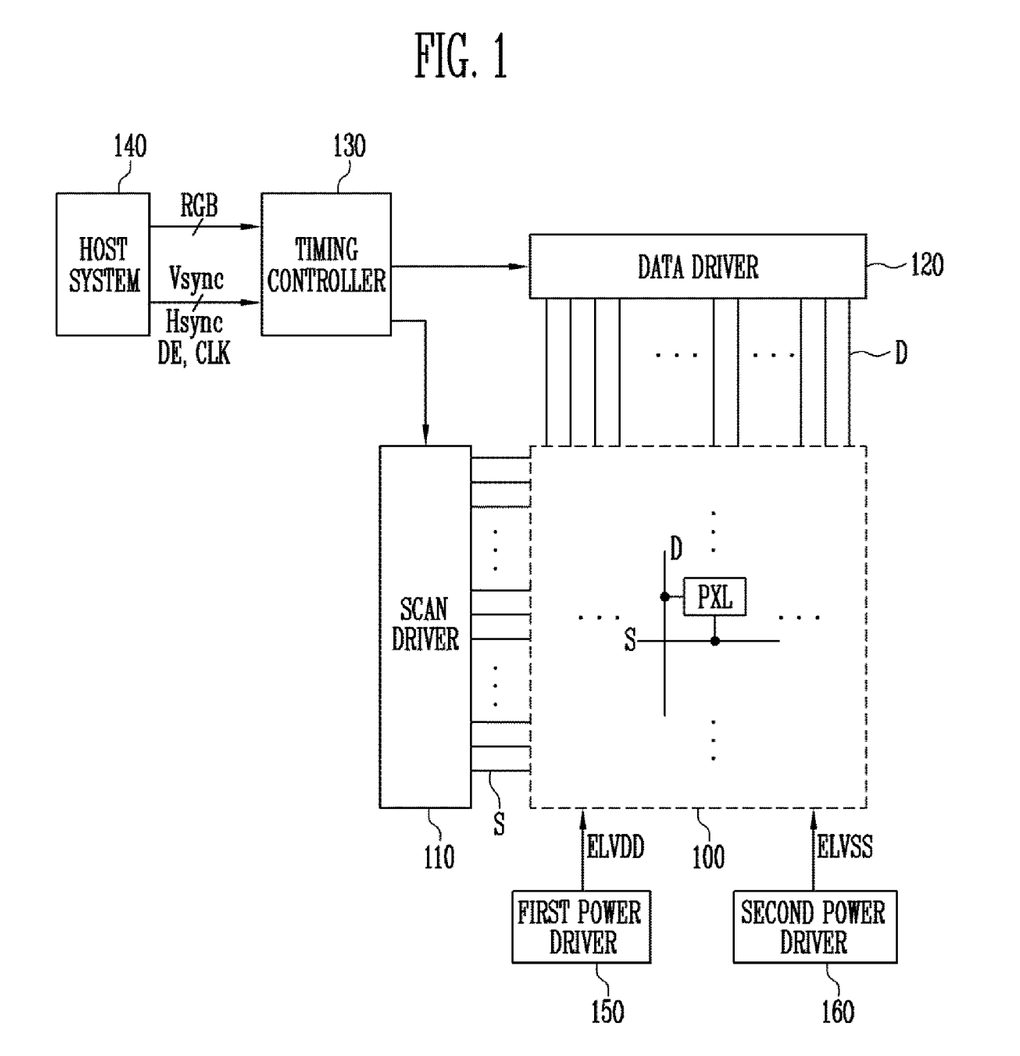
FIG. 1 is a schematic diagram illustrating an organic light-emitting display device according to an exemplary embodiment of the invention.

FIG. 1 is a schematic diagram illustrating an organic light-emitting display device according to an exemplary embodiment of the invention.

Referring to FIG. 1, the organic light-emitting display device includes a pixel unit 100, a scan driver 110, a data driver 120, a timing controller 130, a host system 140, a first power driver 150, and a second power driver 160.

Figure 3:
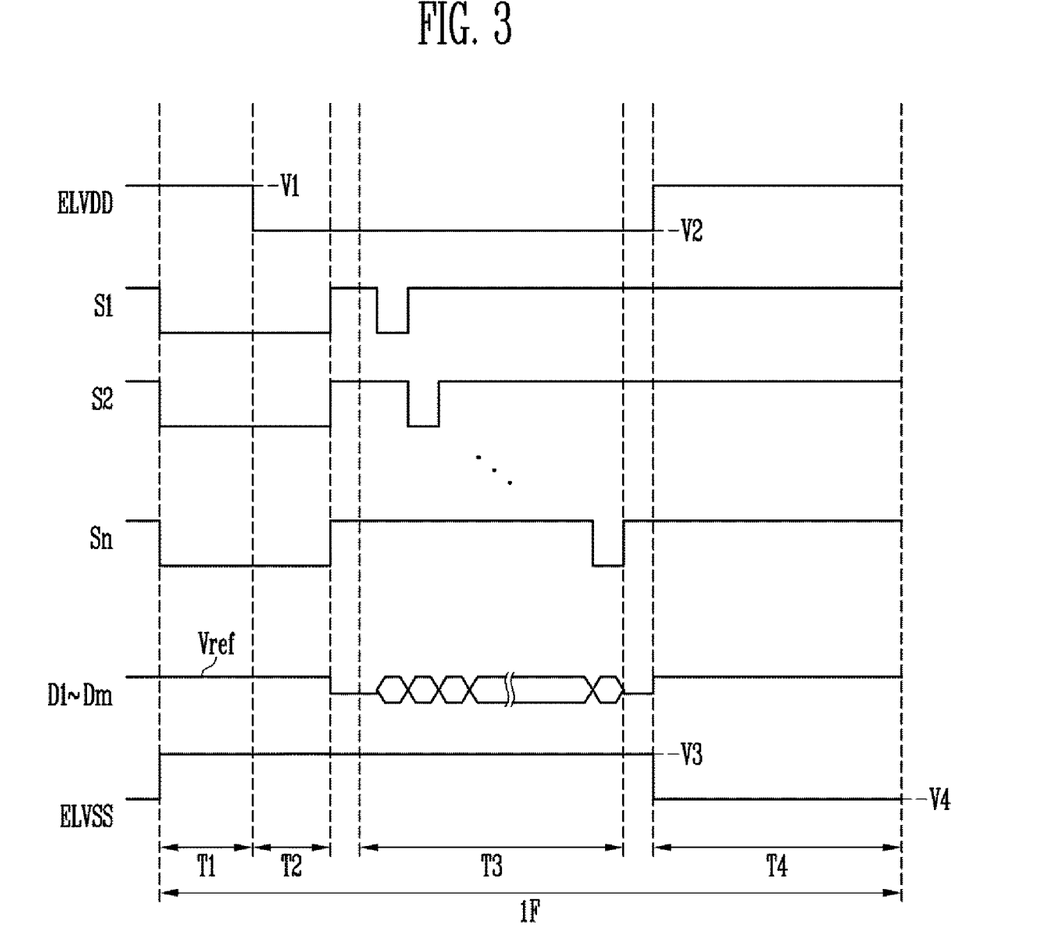
FIG. 3 is a waveform diagram illustrating a method of driving the pixel illustrated in FIG. 2.

In an exemplary embodiment, one frame period may be driven, with the frame period being divided into a first period T1, a second period T2, a third period T3, and a fourth period T4, as illustrated in FIG. 3.

The first period T1 may be set to a period during which pixels PXL are initialized, the second period T2 may be set to a period during which the threshold voltages of the pixels PXL are compensated for, the third period T3 may be set to a period during which data signals are supplied to the pixels PXL, and the fourth period T4 may be set to a period during which the pixels PXL emit light. Here, during the first period T1, the second period T2, and the fourth period T4, the pixels PXL are simultaneously driven, and during the third period T3, the pixels PXL are sequentially driven.

The scan driver 110 supplies scan signals to scan lines S1, S2, . . . Sn. For example, the scan driver 110 may simultaneously supply scan signals to the scan lines S1, S2, . . . Sn during the first period T1 and the second period T2. Further, the scan driver 110 may sequentially supply scan signals to the scan lines S1, S2, . . . Sn during the third period T3.

When scan signals are supplied to the scan lines S1, S2, . . . Sn, transistors included in respective pixels PXL are turned on. For this operation, the scan signals are set to a gate-on voltage (e.g., a low voltage) so that the transistors included in respective pixels PXL may be turned on.

The data driver 120 supplies a reference voltage Vref to data lines D1, D2, . . . Dm during the first period T1 and the second period T2. Here, the reference voltage Vref is set to a voltage that enables driving transistors included in respective pixels PXL to be turned on. The reference voltage Vref may be set to a specific voltage within a voltage range of data signals, for example, a voltage between a black grayscale and grayscale 1. In other words, when the voltage of a black grayscale is set to 6.5 V and the voltage of grayscale 1 is set to 6 V, the reference voltage Vref may be set to a voltage between 6 V and 6.5 V.

Further, the data driver 120 supplies data signals to data lines D1, D2, . . . Dm in synchronization with the scan signals during the third period T3. The data signals may be set to voltages corresponding to various grayscales so that a predetermined image may be displayed.

The timing controller 130 may control the drivers 110, 120, 150, and 160 based on timing signals, such as image data RGB, a vertical synchronization signal Vsync, a horizontal synchronization signal Hsync, a data enable signal DE, and a clock signal CLK, which are outputted from the host system 140.

The host system 140 supplies the image data RGB to the timing controller 130 through a predetermined interface. Further, the host system 140 supplies the timing signals Vsync, Hsync, DE, and CLK to the timing controller 130.

The first power driver 150 supplies the voltage of first driving power ELVDD to the pixels PXL. Here, the first power driver 150 may supply first driving power ELVDD having a first voltage V1 during the first period T1 and the fourth period T4, and may supply first driving power ELVDD having a second voltage V2 lower than the first voltage V1 during the second period T2 and the third period T3. Here, the first voltage V1 may be set to a sufficiently high voltage to allow the pixels PXL to emit light.

The second power driver 160 supplies the voltage of second driving power ELVSS to the pixels PXL. Here, the second power driver 160 may supply second driving power ELVSS having a third voltage V3 during the first to third periods T1 to T3, and may supply second driving power ELVSS having a fourth voltage V4 lower than the third voltage V3 during the fourth period T4. Here, the third voltage V3 may be set such that the pixels PXL do not emit light, and the fourth voltage V4 may be set such that the pixels PXL may emit light. For example, the third voltage V3 may be set to a voltage equal to the first voltage V1, and the fourth voltage V4 may be set to a voltage equal to the second voltage V2.

The pixel unit 100 may include a plurality of pixels PXL which are disposed to be coupled to the data lines D1, D2, . . . Dm and the scan lines S1, S2, . . . Sn. The pixels PXL emit light having a predetermined luminance to the outside of the pixel unit in accordance with data signals.

Figure 2:
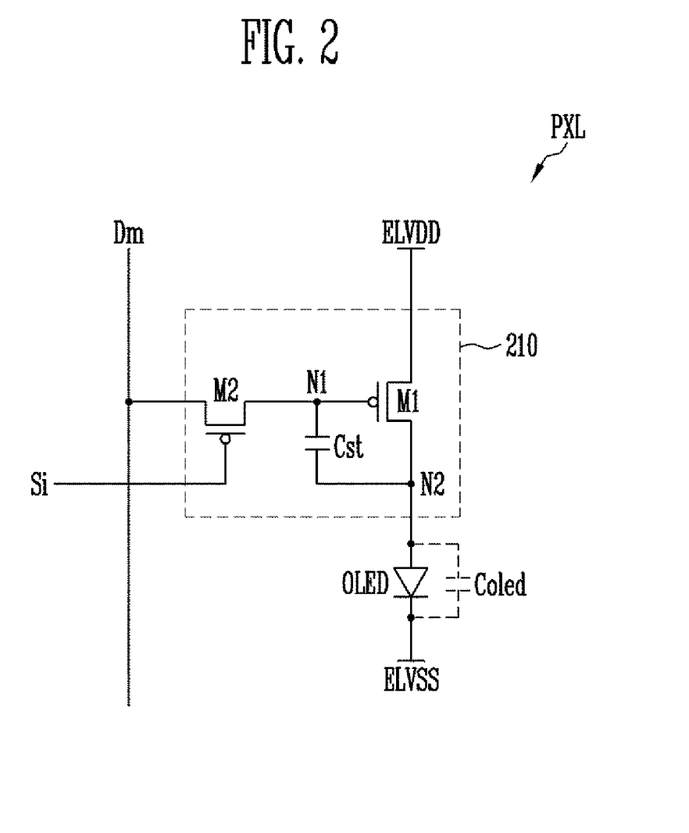
FIG. 2 is a schematic diagram illustrating a pixel illustrated in FIG. 1.

FIG. 2 is a schematic diagram illustrating an embodiment of a pixel illustrated in FIG. 1. In FIG. 2, for convenience of description, a pixel PXL which is coupled to an i-th scan line Si and an m-th data line Dm is illustrated.

Referring to FIG. 2, the pixel PXL according to an exemplary embodiment includes an organic light-emitting diode (OLED) and a pixel circuit 210 for controlling the amount of current that is supplied to the OLED.

An anode electrode of the OLED is coupled to the pixel circuit 210, and a cathode electrode of the OLED is coupled to a second driving power source ELVSS. Such an OLED generates light having a predetermined luminance depending on the amount of current supplied from the pixel circuit 210.

The pixel circuit 210 controls the amount of current that is supplied to the OLED in accordance with a data signal. For this operation, the pixel circuit 210 may include a first transistor M1 (or a driving transistor), a second transistor M2 (or a switching transistor), and a storage capacitor Cst.

The first transistor M1 may be coupled between a first driving power source ELVDD and a second node N2. Here, the second node N2 means a node electrically coupled to the anode electrode of the OLED. A gate electrode of the first transistor M1 is coupled to a first node N1. The first transistor M1 controls the amount of current that flows from the first driving power source ELVDD to the second driving power source ELVSS via the OLED in response to the voltage of the first node N1.

The second transistor M2 may be coupled between the data line Dm and the first node N1. A gate electrode of the second transistor M2 may be coupled to the i-th scan line Si. The second transistor M2 may be turned on when a scan signal is supplied to the i-th scan line Si, and may then electrically couple the data line Dm to the first node N1.

In an exemplary embodiment, the first transistor M1 and the second transistor M2 may be implemented as P-type transistors (e.g., PMOS transistors).

The storage capacitor Cst may be coupled between the first node N1 and the second node N2. Such a storage capacitor Cst stores a voltage corresponding to both the data signal and the threshold voltage of the first transistor M1.

In addition, an organic capacitor Coled illustrated in FIG. 2 means a capacitor formed equivalently to the OLED. Such an organic capacitor Coled is set to have a capacitance lower than that of the storage capacitor Cst. For example, the storage capacitor Cst may be set to have a capacitance that is at least 10 times that of the organic capacitor Coled.

FIG. 3 is a waveform diagram illustrating an exemplary embodiment of a method of driving the pixel illustrated in FIG. 2.

Referring to FIGS. 2 and 3, scan signals are supplied first to scan lines S1, S2, . . . Sn and the reference voltage Vref is supplied to data lines D1, D2, . . . Dm during the first period T1 and the second period T2. Further, the first driving power ELVDD is set to the first voltage V1 during the first period T1. Furthermore, the second driving power ELVSS is set to the third voltage V3 during the first to third periods T1 to T3. When the second driving power ELVSS is set to the third voltage V3, current cannot flow from the OLED to the second driving power source ELVSS. Therefore, the pixels PXL may enter a non-emissive state during the first to third periods T1 to T3.

When a scan signal is supplied to the i-th scan line Si, the second transistor M2 is turned on. When the second transistor M2 is turned on, the data line Dm is electrically coupled to the first node N1. Then, the reference voltage Vref supplied to the data line Dm is supplied to the first node N1.

Here, the reference voltage Vref is set such that the first transistor M1 may be turned on, and thus, the first transistor M1 is turned on. When the first transistor M1 is turned on, the voltage of the second node N2 increases up to the first voltage V1.

Meanwhile, scan signals are simultaneously supplied to all scan lines S1, S2, . . . Sn during the first period T1. Therefore, the first nodes N1 respectively included in all of the pixels PXL are initialized to the reference voltage Vref, and the second nodes N2 respectively included in all of the pixels PXL are initialized to the first voltage V1.

During the second period T2, the first driving power ELVDD is set to the second voltage V2 lower than the first voltage V1. Here, the second transistor M2 remains turned on, and thus, the first node N1 remains at the reference voltage Vref.

Since the second transistor M2 remains turned on, current is supplied from the second node N2 set to the first voltage V1 to the first driving power ELVDD set to the second voltage V2, and thus, the voltage of the second node N2 gradually decreases. Also, when the voltage of the second node N2 is set to a voltage higher than that of the first node N1 by the absolute value of the threshold voltage of the first transistor M1, the first transistor M1 is turned off.

Here, the first node N1 is set to the reference voltage Vref, and the second node N2 is set to a voltage obtained by adding the absolute value of the threshold voltage of the first transistor M1 to the reference voltage Vref. Accordingly, a voltage corresponding to the threshold voltage of the first transistor M1 is stored in the storage capacitor Cst during the second period T2.

Meanwhile, during the above-described second period T2, all of the pixels PXL are simultaneously driven. Accordingly, during the second period T2, the voltage corresponding to the threshold voltage of the first transistor M1 is stored in the storage capacitor Cst included in each of the pixels PXL.

In addition, since the pixels PXL are simultaneously driven during the second period T2, a sufficient time may be allocated. That is, in this exemplary embodiment, sufficient time may be allocated during the second period T2, so that the threshold voltages of the pixels PXL may be stably compensated for, and thus, the pixels PXL may be applied to a high-resolution panel.

During the third period T3, scan signals are sequentially supplied to the scan lines S1, S2, . . . Sn. For example, the scan signals may be sequentially supplied to the scan lines ranging from the first scan line S1 to the n-th scan line Sn. Also, data signals are supplied to the D1, D2, . . . Dm in synchronization with the scan signals.

When a scan signal is supplied to the i-th scan line Si, the second transistor M2 is turned on. When the second transistor M2 is turned on, a data signal is supplied from the data line Dm to the first node N1.

When a data signal corresponding to a black grayscale is supplied to the first node N1, the voltage of the first node N1 increases from the reference voltage Vref to the voltage of the data signal corresponding to the black grayscale. When the voltage of the first node N1 increases, the first transistor M1 is turned off.

When a data signal other than the data signal corresponding to the black grayscale is supplied to the first node N1, the voltage of the first node N1 decreases from the reference voltage Vref to the voltage of the data signal. When the voltage of the first node N1 decreases, the voltage of the second node N2 also decreases due to the coupling of the storage capacitor Cst. Thereafter, the supply of the scan signal to the i-th scan line Si is stopped, and the second transistor M2 is turned off.

Meanwhile, when the voltages of the first node N1 and the second node N2 decrease, the first transistor M1 is turned on. When the first transistor M1 is turned on, the voltage of the second node N2 decreases down to about the second voltage V2, and the voltage of the first node N1 also decreases due to the coupling of the storage capacitor Cst. In this case, a voltage corresponding to the threshold voltage of the first transistor M1 is transferred to the first node N1. Therefore, the voltage of the first node N1 is set to a voltage corresponding to the data signal and the threshold voltage of the first transistor M1. For example, the voltage of the first node N1 may be set as given in the following Equation (1):

$$V_{N1} = \alpha \times V\text{data} + V2 + V\text{th} \quad (1)$$

In Equation (1), "α" is a value corresponding to the ratio of the storage capacitor Cst to the organic capacitor Coled. The ratio of the voltage decrease of the first node N1 to the voltage decrease of the second node N2 may be determined in accordance with the ratio of the storage capacitor Cst to the organic capacitor Coled, and "a" may be set to a value corresponding to the ratio.

In Equation (1), Vdata denotes the voltage value of the data signal, and Vth denotes the threshold voltage of the first transistor M1.

Meanwhile, since scan signals are sequentially supplied to the scan lines S1, S2, . . . Sn during the third period T3, the voltage corresponding to Equation (1) is applied to the first node N1 included in each of the pixels PXL.

During the fourth period T4, the voltage of the first driving power ELVDD increases to the first voltage V1, and the voltage of the second driving power ELVSS decreases to the fourth voltage V4. Then, the first transistor M1 included in each of the pixels PXL supplies current corresponding to the voltage of the first node N1 to the OLED, and thus, a grayscale corresponding to the data signal may be implemented. For example, the amount of current supplied to the OLED during the fourth period T4 may be represented by the following Equation (2):

$$\begin{aligned} I_{oled} &= K \times (Vgs - Vth)^2 \quad (2) \\ &= K \times (\alpha \times V\text{data} + V2 + V\text{th} - V\text{th})^2 \\ &= K \times (\alpha \times V\text{data} + V2)^2 \end{aligned}$$

Referring to Equation (2), current flowing through the OLED is determined regardless of the threshold voltage of the first transistor M1. Therefore, in an exemplary embodiment, a desired grayscale may be implemented regardless of the threshold voltage of the first transistor M1.

Meanwhile, in an exemplary embodiment, a voltage lower than the reference voltage Vref may be supplied to the data lines D1, D2, . . . Dm during an interval between the second period T2 and the third period T3. Here, since scan signals are not supplied to the scan lines S1, S2, . . . Sn, the voltages of the first node N1 and the second node N2 included in each of the pixels PXL are not changed.

Figure 4:
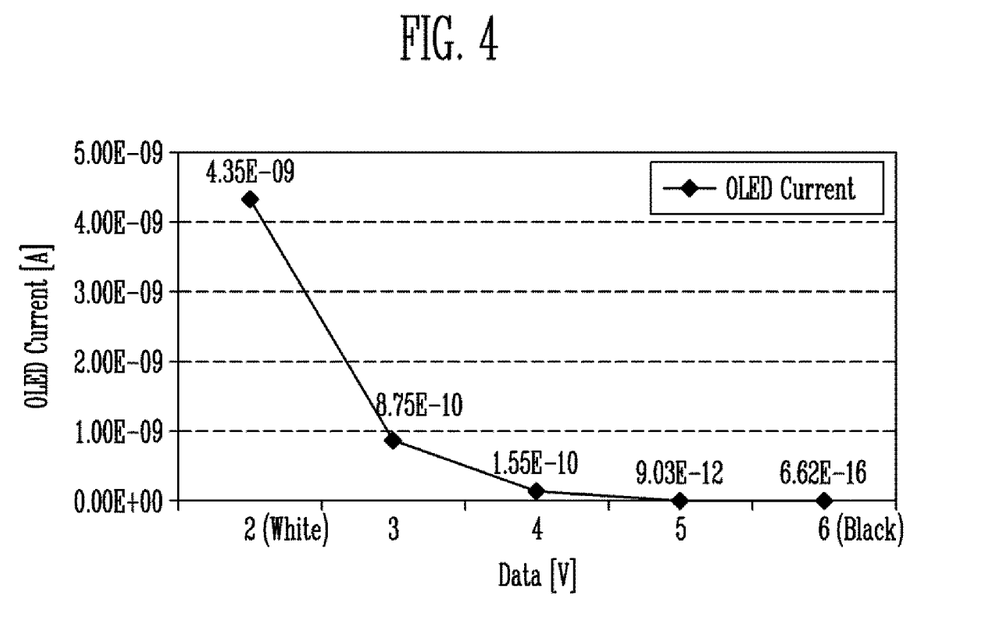
FIG. 4 is a graph illustrating the amount of current supplied to an organic light-emitting diode in accordance with a data signal.

FIG. 4 is a graph illustrating the amount of current supplied to an organic light-emitting diode in accordance with a data signal. In FIG. 4, the voltage of a data signal corresponding to a white grayscale is set to 2 V, and the voltage of a data signal corresponding to a black grayscale is set to 6 V.

Referring to FIG. 4, when the voltages of data signals corresponding to grayscales from a white grayscale to a black grayscale are supplied to the pixel PXL, it can be seen that the amount of current supplied to the OLED decreases in a direction from the white grayscale to the black grayscale. That is, the pixel PXL according to an exemplary embodiment may stably implement grayscales in accordance with data signals.

Figure 5:
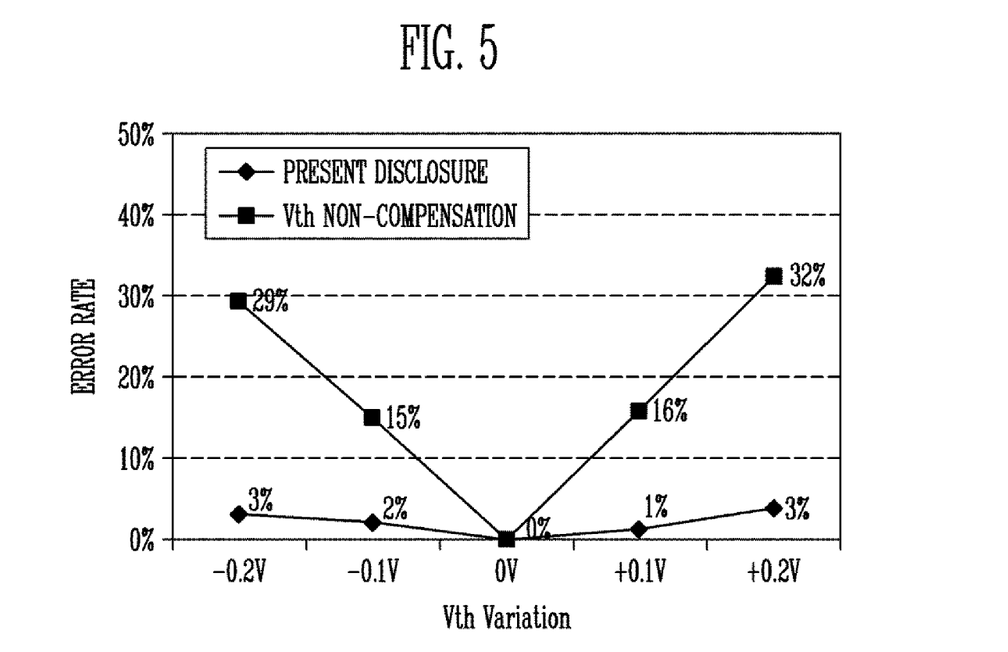
FIG. 5 is a graph illustrating the compensation of the threshold voltage of a pixel according to an exemplary embodiment of the invention.

FIG. 5 is a graph illustrating the compensation of the threshold voltage of a pixel according to an exemplary embodiment.

Referring to FIG. 5, when the threshold voltage of a first transistor M1 in a pixel PXL according to an exemplary embodiment is changed from −0.2 V to +0.2 V, a maximum error rate is set to about 3%. Conversely, when the threshold voltage is not compensated for in the pixel PXL, the maximum error rate is set to about 32%. That is, in an exemplary embodiment, the threshold voltage of the driving transistor M1 may be stably compensated for the two transistors M1 and M2 and one capacitor Cst.

Figure 6:
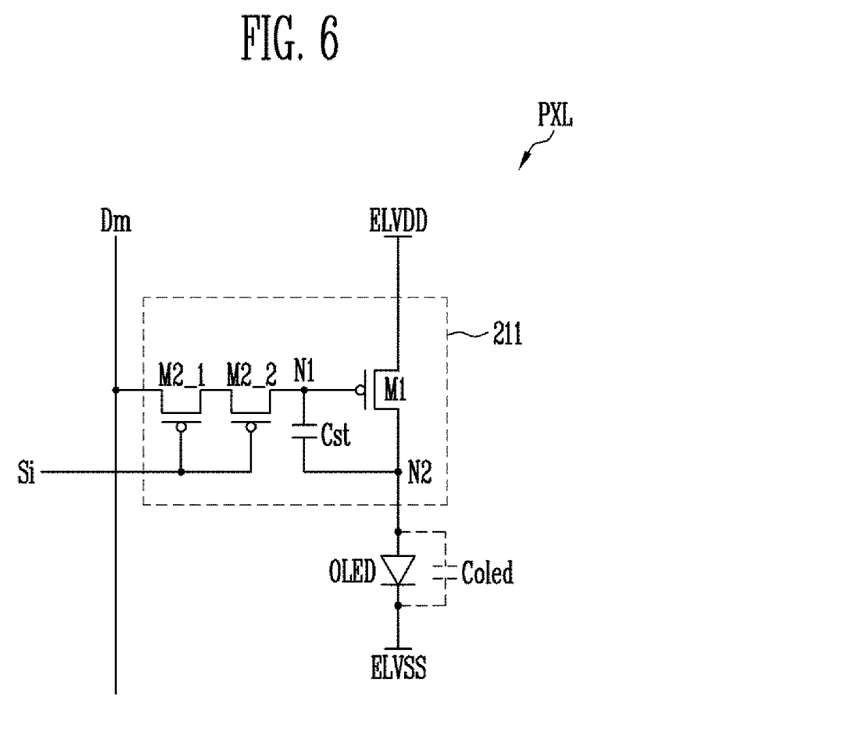
FIG. 6 is a schematic diagram illustrating a pixel according to an embodiment of the present disclosure.

FIG. 6 is a schematic diagram illustrating a pixel according to an exemplary embodiment. In the description of FIG. 6, the same reference numerals are allocated to designate components identical to those of FIG. 2, and thus, a detailed description thereof will be omitted.

Referring to FIG. 6, a pixel PXL according to an exemplary embodiment may include an OLED and a pixel circuit 211 for controlling the amount of current that is supplied to the OLED.

An anode electrode of the OLED is coupled to the pixel circuit 211, and a cathode electrode of the OLED is coupled to a second driving power source ELVSS. Such an OLED generates light having a predetermined luminance depending on the amount of current that is supplied from the pixel circuit 211.

The pixel circuit 211 controls the amount of current that is supplied to the OLED in accordance with a data signal.

For this operation, the pixel circuit 211 may include a first transistor M1, second transistors M2_1 and M2_2, and a storage capacitor Cst.

The second transistors M2_2 and M2_2 may include a plurality of transistors coupled in series between a data line Dm and a first node N1. When the second transistors M2_1 and M2_2 are implemented using the plurality of transistors in this way, a leakage current from the first node N1 may be minimized, and thus, driving stability may be secured.

Figure 7:
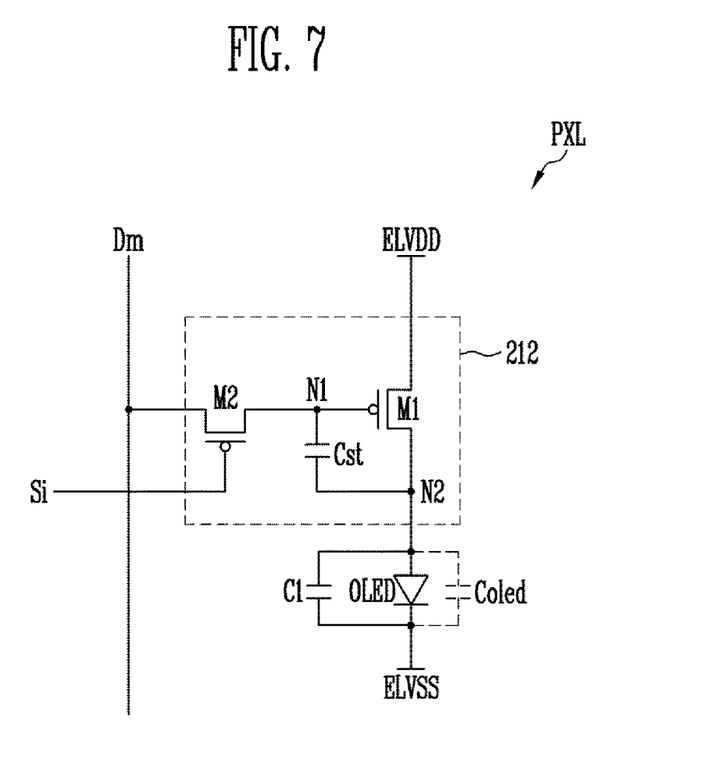
FIG. 7 is a schematic diagram illustrating a pixel according to an exemplary embodiment of the invention.

FIG. 7 is a schematic diagram illustrating a pixel according to an exemplary embodiment. In the description of FIG. 7, the same reference numerals are allocated to designate components identical to those of FIG. 2, and thus, a detailed description thereof will be omitted.

Referring to FIG. 7, a pixel PXL according to an exemplary embodiment may include an OLED and a pixel circuit 212 for controlling the amount of current that is supplied to the OLED.

An anode electrode of the OLED is coupled to the pixel circuit 212, and a cathode electrode of the OLED is coupled to a second driving power source ELVSS. Such an OLED generates light having a predetermined luminance depending on the amount of current that is supplied from the pixel circuit 212.

The pixel circuit 212 controls the amount of current that is supplied to the OLED in accordance with a data signal. For this operation, the pixel circuit 212 may include a first transistor M1, a second transistor M2, a storage capacitor Cst, and a first capacitor C1.

The first capacitor C1 is coupled between a second node N2 and the second driving power source ELVSS. The first capacitor C1 provides a predetermined capacitance so that the voltage of the second node N2 gradually increases.

In detail, during a third period T3, the voltage of the second node N2 decreases to a second voltage V2, and thereafter increases in response to the voltage of a data signal. Here, as capacitance between the second node N2 and the second driving power source ELVSS increases, the voltage of the second node N2 gradually increases. In other words, when the first capacitor C1 is added, the capacitance between the second node N2 and the second driving power source ELVSS increases, and thus, the voltage of the second node N2 may increase for a long period of time.

When the voltage of the second node N2 increases for a long period of time, the voltage of the first node N1 also increases for a long period of time depending on variation in the voltage of the second node N2. In this case, the voltage of the first node N1 may be stably changed to a desired voltage, and thus, driving stability may be secured.

In addition, in an exemplary embodiment, the variable "a" described in Equation (1) may be controlled by controlling the capacitance of the first capacitor C1.

Figure 8:
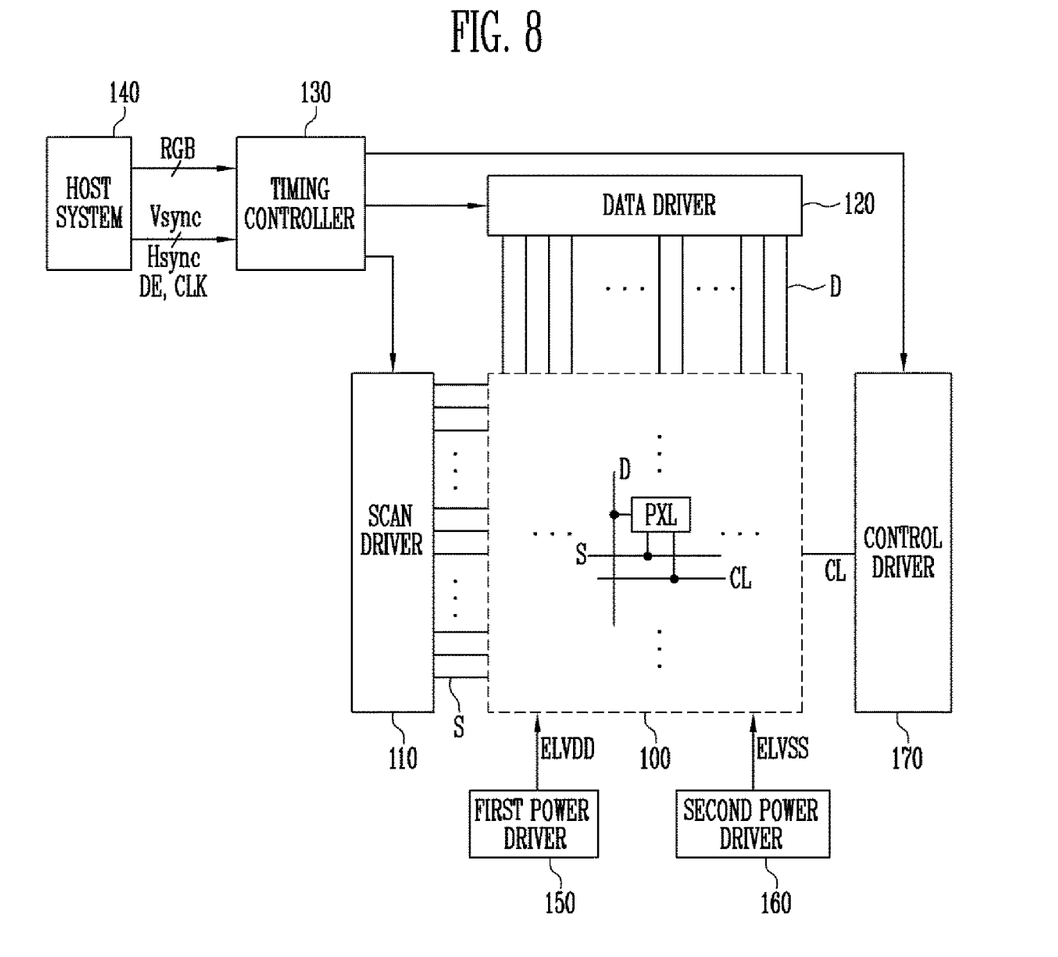
FIG. 8 is a diagram schematically illustrating an organic light-emitting display device in accordance with an exemplary embodiment of the invention.

FIG. 8 is a diagram schematically illustrating an organic light-emitting display device according to an embodiment of the present disclosure. In the following description of FIG. 8, the same reference numerals are allocated to designate components identical to those of FIG. 1, and thus a detailed description thereof will be omitted.

Referring to FIG. 8, the organic light-emitting display device according to an embodiment of the present disclosure may include a pixel unit 100, a scan driver 110, a data driver 120, a timing controller 130, a host system 140, a first power driver 150, a second power driver 160, and a control driver 170.

Figure 10:
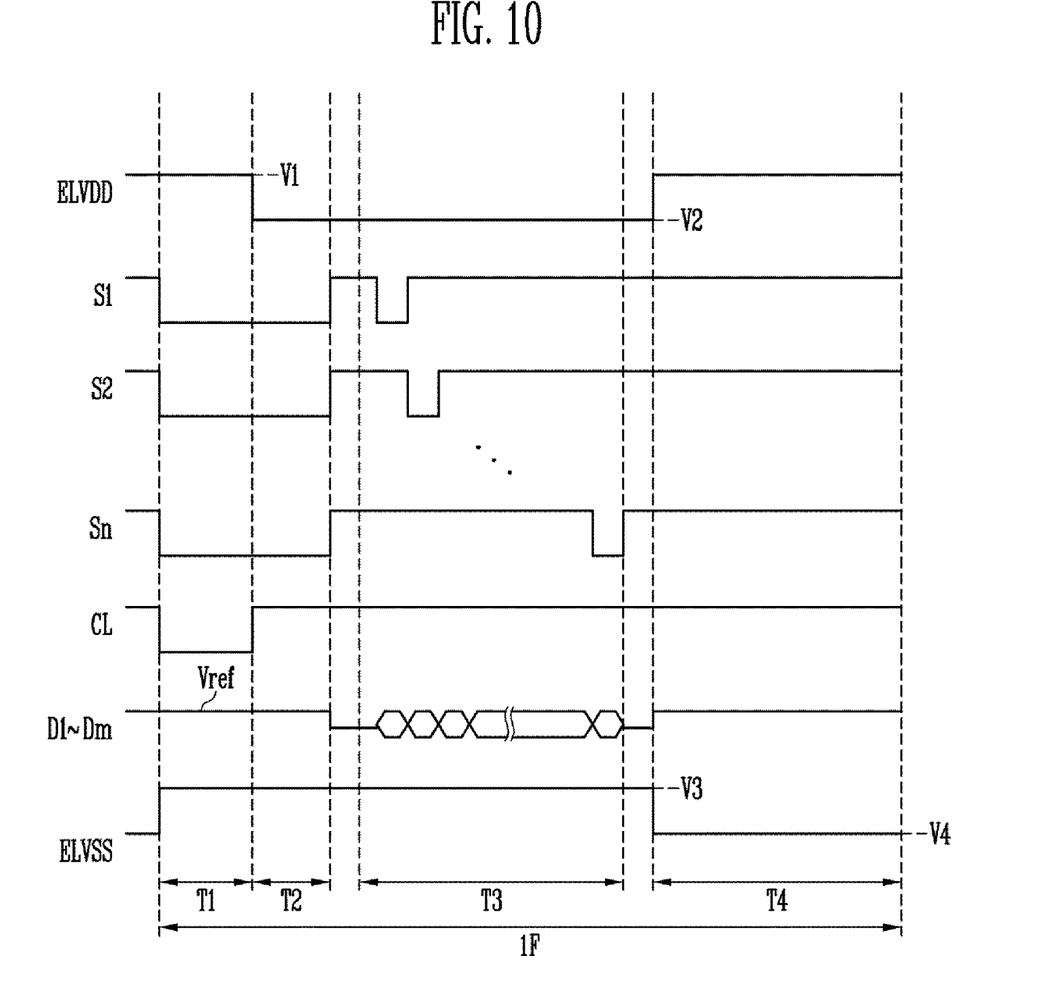
FIG. 10 is a waveform diagram illustrating a method of driving the pixel illustrated in FIG. 9.

The control driver 170 may provide a control signal to a control line CL during a first period T1 of one frame period 1F, as illustrated in FIG. 10. Here, the control line CL may be coupled in common to pixels PXL. Therefore, the control signal provided from the control driver 170 is provided to all pixels PXL.

When the control signal is provided to the control line CL, transistors included in respective pixels PXL are turned on. For this operation, the control signal is set to a gate-on voltage (e.g., a low voltage) so that the transistors included in respective pixels PXL may be turned on.

Meanwhile, in the above description, although the control driver 170 is described as providing the control signal, the present disclosure is not limited thereto. For example, the control line CL may be coupled to the scan driver 110. In this case, the scan driver 110 may provide the control signal to the control line CL during the first period T1.

Figure 9:
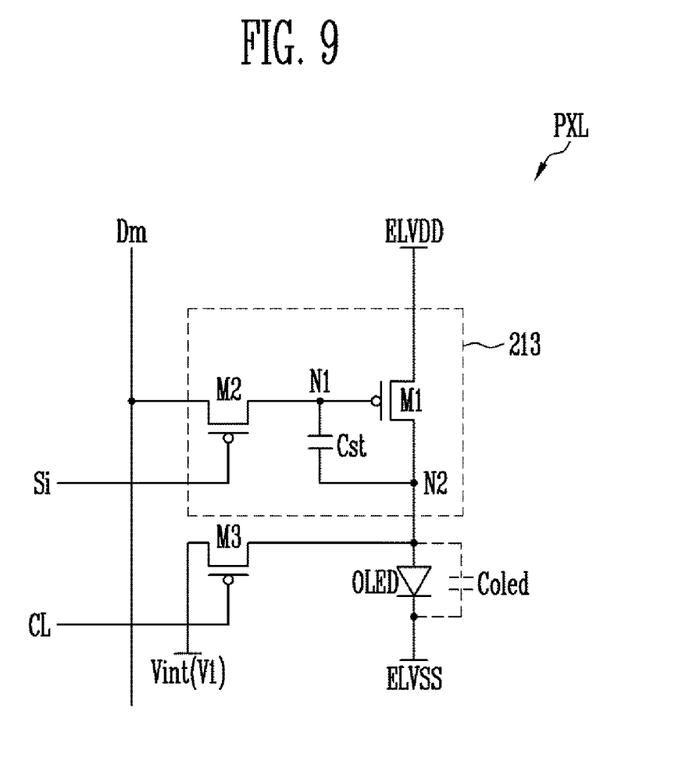
FIG. 9 is a schematic diagram illustrating an exemplary embodiment of a pixel illustrated in FIG. 8.

FIG. 9 is a schematic diagram illustrating an embodiment of a pixel illustrated in FIG. 8. In the description of FIG. 9, the same reference numerals are allocated to components identical to those of FIG. 2, and thus, a detailed description thereof will be omitted.

Referring to FIG. 9, the pixel PXL according to an exemplary embodiment may include an OLED and a pixel circuit 213 for controlling the amount of current that is supplied to the OLED.

An anode electrode of the OLED is coupled to the pixel circuit 213, and a cathode electrode of the OLED is coupled to a second driving power source ELVSS. Such an OLED generates light having a predetermined luminance depending on the amount of current that is supplied from the pixel circuit 213.

The pixel circuit 213 controls the amount of current that is supplied to the OLED in accordance with a data signal. For this operation, the pixel circuit 213 may include a first transistor M1, a second transistor M2, a third transistor M3, and a storage capacitor Cst.

The third transistor M3 may be coupled between a second node N2 and an initialization power source Vint. Also, a gate electrode of the third transistor M3 may be coupled to a control line CL. Such a third transistor M3 is turned on when the control signal is provided to the control line CL, and then supplies the voltage of the initialization power source Vint to the second node N2. Here, the voltage of the initialization power source Vint is set to a first voltage V1.

That is, the third transistor M3 supplies the first voltage V1 of the initialization power source Vint to the second node N2 during a first period T1 in which the control signal is provided. In other words, in order to insure driving stability, the third transistor M3 is used to supply the first voltage V1 to the second node N2 during the first period T1.

FIG. 10 is a waveform diagram illustrating an exemplary embodiment of a method of driving the pixel illustrated in FIG. 9. In the description of FIG. 10, components identical to those of FIG. 3 will be described in brief.

Referring to FIGS. 9 and 10, when a scan signal is supplied to an i-th scan line Si during the first period T1, the second transistor M2 is turned on. When the second transistor M2 is turned on, the data line Dm and the first node N1 are electrically coupled to each other. Then, a reference voltage Vref supplied to the data line Dm is supplied to the first node N1.

Here, the reference voltage Vref is set such that the first transistor M1 may be turned on, and thus, the first transistor M1 is turned on. When the first transistor M1 is turned on, the voltage of the second node N2 increases up to the first voltage V1.

In addition, the third transistor M3 is turned on in response to the control signal provided to the control line CL during the first period T1. When the third transistor M3 is turned on, the first voltage V1 of the initialization power source Vint is supplied to the second node N2, and thus, the voltage of the second node N2 is stably set to the first voltage V1.

During the second period T2, the first driving power ELVDD is set to a second voltage V2 lower than the first voltage V1. During the second period T2, a voltage corresponding to the threshold voltage of the first transistor M1 is stored in the storage capacitor Cst.

During the third period T3, scan signals are sequentially supplied to the scan lines S1, S2, . . . Sn. When a scan signal is supplied to the i-th scan line Si, the second transistor M2 is turned on. When the second transistor M2 is turned on, a data signal is supplied from the data line Dm to the first node N1. Then, in the storage capacitor Cst, a voltage corresponding to the data signal and the threshold voltage of the first transistor M1 is stored.

During the fourth period T4, the voltage of the first driving power ELVDD increases to the first voltage V1, and the voltage of the second driving power ELVSS decreases to the fourth voltage V4. Then, the first transistor M1 included in each of the pixels PXL may supply a current corresponding to the voltage of the first node N1 to the OLED, and thus, a grayscale corresponding to the data signal may be implemented.

Actually, the pixels PXL according to an exemplary embodiment may repeat the above-described procedure for each frame, so that a predetermined image may be displayed on the pixel unit 100.

Meanwhile, the OLED according to the inventive concepts may generate various types of light having colors including red, green, and blue depending on the amount of current that is supplied from the driving transistor. Further, the OLED may also generate white light depending on the amount of current that is supplied from the driving transistor. Furthermore, the colors of light may also be controlled using a separate color filter besides the OLED.

In accordance with exemplary embodiments of the organic light-emitting display device and the method of driving the organic light-emitting display device, the threshold voltages of driving transistors included in respective pixels may be simultaneously compensated for, and thus, sufficient time may be allocated to a threshold voltage compensation period. That is, in accordance with an exemplary embodiment, the threshold voltages of driving transistors may be stably compensated for, and thus, the inventive concepts may then be applied to a high-resolution panel.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display device configured to be driven, with one frame comprising a first period, a second period contiguous with the first period, a third period, and a fourth period, in order, the organic light-emitting display device being driven in order from the first period to the fourth period, comprising:
   a first power supply configured to supply a first driving power source, the first driving power source having a constant first voltage during the first period and the fourth period and a constant second voltage lower than the first voltage during the second period and the third period;
   a second power supply configured to supply a second driving power source, the second driving power source having a constant third voltage during the first to third periods and a constant fourth voltage lower than the third voltage during the fourth period; and
   pixels coupled to scan lines and data lines,
   wherein a pixel disposed on an i-th (where i is a natural number) horizontal line and an m-th (where m is a natural number) vertical line comprises:
      an organic light-emitting diode;
      a first transistor coupled between the first driving power source and an anode electrode of the organic light-emitting diode, and comprising a gate electrode connected to a first node;
      a second transistor coupled between an m-th data line and the first node, and comprising a gate electrode connected to an i-th scan line; and
      a storage capacitor coupled between the first node and the anode electrode of the organic light-emitting diode, and
   wherein, in the first period, the first transistor is turned on by a reference voltage supplied to the m-th data and the first voltage is supplied to the anode electrode of the organic light-emitting diode through the first transistor, which is turned on.

2. The organic light-emitting display device according to claim 1, further comprising:
   a scan driver configured to simultaneously supply scan signals to the scan lines during the first period and the second period, and sequentially supply the scan signals to the scan lines during the third period; and
   a data driver configured to supply the reference voltage to the data lines during the first period and the second period and supply data signals to the data lines in synchronization with the scan signals during the third period.

3. The organic light-emitting display device according to claim 2, wherein the reference voltage is set to a specific voltage within a voltage range of the data signals that are capable of being supplied from the data driver.

4. The organic light-emitting display device according to claim 3, wherein the reference voltage is set to a voltage level between a data signal voltage corresponding to a black grayscale and a data signal voltage corresponding to grayscale 1.

5. The organic light-emitting display device according to claim 1, wherein the third voltage is set such that the pixels do not emit light, and the fourth voltage is set such that the pixels emit light.

6. The organic light-emitting display device according to claim 1, wherein the second transistor comprises a plurality of transistors connected in series with each other.

7. The organic light-emitting display device according to claim 1, wherein:
   an organic capacitor is equivalently formed between the anode electrode of the organic light-emitting diode and the second driving power source; and
   the pixel further comprises a first capacitor coupled in parallel to the organic capacitor between the anode electrode of the organic light-emitting diode and the second driving power source.

8. The organic light-emitting display device according to claim 1, wherein the pixel further comprises a third transistor coupled between the anode electrode of the organic light-emitting diode and an initialization power source, and configured to be turned on when a control signal is supplied to a control line.

9. The organic light-emitting display device according to claim 8, wherein the control line is coupled in common to all pixels.

10. The organic light-emitting display device according to claim 8, wherein a scan driver provides the control signal to the control line during the first period.

11. The organic light-emitting display device according to claim 8, further comprising a control driver configured to provide the control signal to the control line during the first period.

12. The organic light-emitting display device according to claim 1, wherein the first transistor and the second transistor are P-type transistors.

13. A method of driving an organic light-emitting display device, the organic light-emitting display device comprising a first driving power source that is set to a constant first voltage during a first period and a fourth period of a frame and is set to a constant second voltage lower than the first voltage during a second period and a third period of the frame, a second driving power source that is set to a constant third voltage during the first to third periods and is set to a constant fourth voltage lower than the third voltage during the fourth period, and pixels coupled to the first driving power source and the second driving power source, the first period, the second period contiguous and with the first period, the third period, and the fourth period proceeding in order, the organic light-emitting display device being driven in order from the first period to the fourth period the method comprising: supplying a reference voltage to a gate electrode of a driving transistor included in each of the pixels through a data line and then supplying the first voltage to an anode electrode of an organic light-emitting diode through the driving transistor, which is turned on by the reference voltage during the first period; storing a voltage corresponding to a threshold voltage of the driving transistor in a storage capacitor coupled between the gate electrode of the driving transistor and the anode electrode of the organic light-emitting diode during the second period; supplying a voltage corresponding to a data signal to the gate electrode at the driving transistor during the third period;

and controlling an amount of current that is supplied to the organic light-emitting diode in response to a voltage applied to the gate electrode of the driving transistor during the fourth period.

14. The method according to claim 13, wherein the reference voltage is set at a level such that the driving transistor is turned on.

15. The method according to claim 13, wherein the pixels are simultaneously driven during the first, second, and fourth periods, and are driven for each horizontal line during the third period.

16. The method according to claim 13, wherein:
each of the pixels comprises a switching transistor coupled between the data line and the driving transistor; and
the switching transistors in respective pixels are set to a turn-on state during the first period and the second period.

17. The method according to claim 16, wherein the switching transistors are sequentially turned on for each horizontal line during the third period.

* * * * *